United States Patent
Seo

(10) Patent No.: US 10,903,009 B2
(45) Date of Patent: Jan. 26, 2021

(54) MULTILAYER CERAMIC ELECTRONIC COMPONENT

(71) Applicant: SAMSUNG ELECTRO-MECHANICS CO., LTD., Suwon-si (KR)

(72) Inventor: Yong Won Seo, Suwon-si (KR)

(73) Assignee: SAMSUNG ELECTRO-MECHANICS CO., LTD., Suwon-si (KR)

(*) Notice: Subject to any disclaimer, the term of this patent is extended or adjusted under 35 U.S.C. 154(b) by 17 days.

(21) Appl. No.: 16/203,154

(22) Filed: Nov. 28, 2018

(65) Prior Publication Data

US 2020/0118754 A1 Apr. 16, 2020

(30) Foreign Application Priority Data

Oct. 10, 2018 (KR) .................. 10-2018-0120586

(51) Int. Cl.
| | |
|---|---|
| *H01G 4/232* | (2006.01) |
| *H01G 4/30* | (2006.01) |
| *H01G 4/12* | (2006.01) |
| *H01G 4/008* | (2006.01) |
| H01G 2/04 | (2006.01) |
| H01G 2/02 | (2006.01) |
| H01G 2/06 | (2006.01) |

(52) U.S. Cl.
CPC ............ *H01G 4/232* (2013.01); *H01G 4/008* (2013.01); *H01G 4/12* (2013.01); *H01G 4/30* (2013.01); *H01G 2/02* (2013.01); *H01G 2/04* (2013.01); *H01G 2/06* (2013.01)

(58) Field of Classification Search
None
See application file for complete search history.

(56) References Cited

U.S. PATENT DOCUMENTS

| | | | | |
|---|---|---|---|---|
| 9,520,232 | B2* | 12/2016 | Nishisaka | H01G 4/2325 |
| 2009/0303656 | A1* | 12/2009 | Ogawa | H01G 4/005 |
| | | | | 361/301.4 |
| 2010/0290172 | A1* | 11/2010 | Motoki | H01G 4/232 |
| | | | | 361/305 |
| 2010/0328842 | A1* | 12/2010 | Takeuchi | C23C 18/165 |
| | | | | 361/301.4 |
| 2015/0090485 | A1* | 4/2015 | Lee | H01G 2/065 |
| | | | | 174/260 |

(Continued)

FOREIGN PATENT DOCUMENTS

| | | |
|---|---|---|
| JP | 2002-093655 A | 3/2002 |
| JP | 2018-101724 A | 6/2018 |

*Primary Examiner* — Dion Ferguson
(74) *Attorney, Agent, or Firm* — Morgan, Lewis & Bockius LLP

(57) ABSTRACT

A multilayer ceramic electronic component includes a ceramic body including a dielectric layer and first and second internal electrodes; and first and second external electrodes, wherein the first and second external electrodes include first and second base electrode layers being at least partially in contact with the first and second external surfaces of the ceramic body, first and second nickel plating layers disposed to cover the first and second base electrode layers, and first and second tin plating layers disposed to cover the first and second nickel plating layers, respectively, and wherein a thickness of a center portion of each of the first and second tin plating layers exceeds 5 µm.

11 Claims, 3 Drawing Sheets

(56) References Cited

U.S. PATENT DOCUMENTS

| | | | |
|---|---|---|---|
| 2015/0279562 A1* | 10/2015 | Nishisaka | H01G 4/008 |
| | | | 361/301.4 |
| 2016/0093444 A1* | 3/2016 | Itamura | H01G 4/248 |
| | | | 174/260 |
| 2017/0018359 A1* | 1/2017 | Kimura | H01G 4/0085 |
| 2017/0069428 A1* | 3/2017 | Shimizu | H01G 4/30 |
| 2017/0365412 A1* | 12/2017 | Taniguchi | H01G 4/1218 |
| 2018/0174753 A1* | 6/2018 | Terashita | H01G 4/248 |
| 2018/0294099 A1* | 10/2018 | Makino | H01G 4/232 |

* cited by examiner

MULTILAYER CERAMIC ELECTRONIC COMPONENT

CROSS-REFERENCE TO RELATED APPLICATION(S)

This application claims the benefit of priority to Korean Patent Application No. 10-2018-0120586 filed on Oct. 10, 2018 in the Korean Intellectual Property Office, the disclosure of which is incorporated herein by reference in its entirety.

TECHNICAL FIELD

The present disclosure relates to a multilayer ceramic electronic component.

BACKGROUND

A multilayer ceramic electronic component is widely used as an IT component in a device such as a computer, a PDA, a cellular phone, or the like due to having small size, secured high capacity, and ease of mounting, and is widely used as an electric component due to high reliability and high rigidity characteristics thereof.

Recently, the multilayer ceramic electronic component is used in wearable electronic devices and microelectronic devices, and thus, a structure considering thinning has been required.

However, the thinned multilayer ceramic electronic component may be relatively greatly influenced by the tensile stress of a solder when mounted on a substrate.

SUMMARY

An aspect of the present disclosure may provide a multilayer ceramic electronic component that may be mounted on a substrate through a tin plating layer of an external electrode.

According to an aspect of the present disclosure, a multilayer ceramic electronic component may include: a ceramic body comprising a dielectric layer and first and second internal electrodes stacked with the dielectric layer interposed therebetween, the first and second internal electrodes being alternately exposed to first and second external surfaces in a length direction; and first and second external electrodes disposed on the first and second external surfaces of the ceramic body and electrically connected to the first and second internal electrodes, respectively, in which the first and second external electrodes include first and second base electrode layers being at least partially in contact with the first and second external surfaces of the ceramic body, first and second nickel plating layers disposed to cover the first and second base electrode layers, and first and second tin plating layers disposed to cover the first and second nickel plating layers, respectively, and wherein a thickness of a center portion of each of the first and second tin plating layers exceeds 5 μm.

According to another aspect of the present disclosure, a multilayer ceramic electronic component may include: a substrate; first and second electrode pads disposed on the substrate; a ceramic body including a dielectric layer and first and second internal electrodes stacked with the dielectric layer interposed therebetween, the first and second internal electrodes being alternately exposed to first and second external surfaces; and first and second external electrodes disposed on the first and second external surfaces of the ceramic body, the first and second external electrodes being electrically connected to the first and second internal electrodes, respectively, and electrically connected to the first and second electrode pads, respectively, in which the first and second external electrodes include first and second base electrode layers being at least partially in contact with the first and second external surfaces of the ceramic body, first and second nickel plating layers disposed to cover the first and second base electrode layers, and first and second tinplating layers disposed to cover the first and second nickel plating layers, respectively, and wherein a thickness of a corner closer to the first and second electrode pads among corners of the first and second tin plating layers is greater than a thickness of a center portion of the first and second tin plating layers.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, exemplary embodiments in the present disclosure will now be described in detail with reference to the accompanying drawings.

When directions of a hexahedron are defined in order to clearly explain the exemplary embodiments in the present disclosure, L, W and T shown in the figures denote a length direction, a width direction and a thickness direction, respectively. Here, the thickness direction may be used to have the same meaning as a stacking direction in which dielectric layers are stacked.

Hereinafter, a multilayer ceramic electronic component according to an exemplary embodiment in the present disclosure will be described, in particular, as a multilayer ceramic capacitor, but the present disclosure is not limited thereto.

Figure 1:
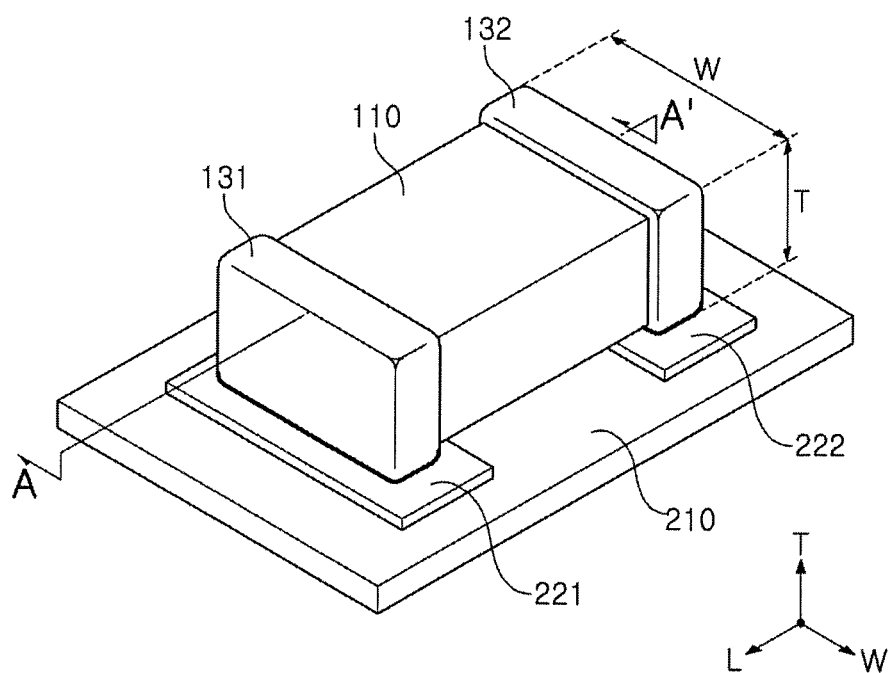
FIG. 1 is a perspective view illustrating a multilayer ceramic electronic component according to an exemplary embodiment in the present disclosure.
Figure 2:
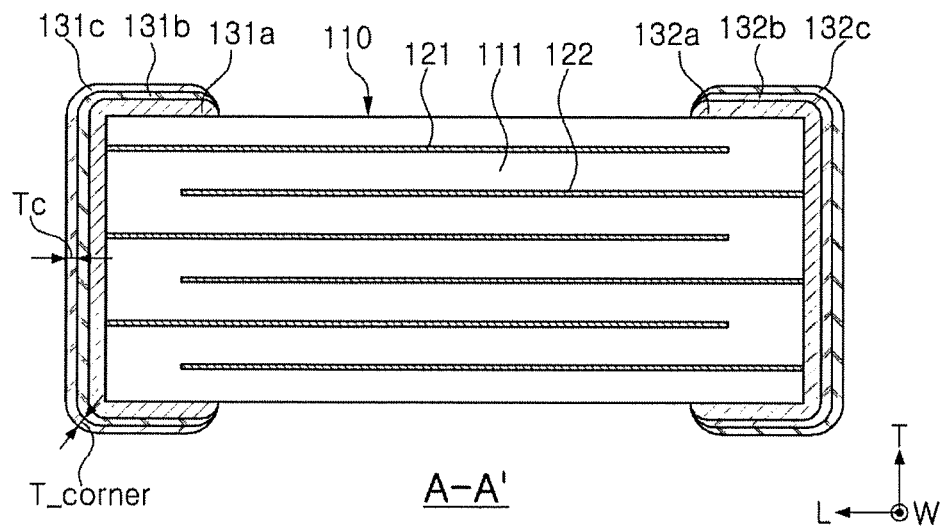
FIG. 2 is a side view illustrating a multilayer ceramic electronic component according to an exemplary embodiment in the present disclosure.

FIG. 1 is a perspective view illustrating a multilayer ceramic electronic component 100 according to an exemplary embodiment in the present disclosure. FIG. 2 is a side view illustrating the multilayer ceramic electronic component 100 according to an exemplary embodiment in the present disclosure.

Referring to FIGS. 1 and 2, the multilayer ceramic electronic component 100 according to an exemplary embodiment in the present disclosure includes a ceramic body 110 and first and second external electrodes 131 and 132.

The ceramic body 110 may be formed as a hexahedron having both side surfaces in a length direction L, both sides in a width direction W and both sides in a thickness direction T. The ceramic body 110 is formed by stacking and then sintering a plurality of dielectric layers 111 in the thickness direction T. The shape and dimensions of the ceramic body 110 and the number (one or more) of stacked dielectric layers 111 are not limited to those shown in the present embodiment.

The plurality of dielectric layers 111 arranged in the ceramic body 110 are in a sintering state. Boundaries between the adjacent dielectric layers 111 may be integrated to be difficult to confirm without using a scanning electron microscope (SEM).

For example, the ceramic body 110 may have a rounded shape with eight corners in the hexahedron. Accordingly, the durability and reliability of the ceramic body 110 may be improved, and the structural reliability of the first and second external electrodes 131 and 132 at the corners may be improved.

A thickness of the dielectric layer 111 may be arbitrarily changed in accordance with the capacity design of the multilayer ceramic electronic component 100. The dielectric layer 111 may include a ceramic powder having a high dielectric constant such as a barium titanate based material ($BaTiO_3$) or a strontium titanate based material ($SrTiO_3$) but the present disclosure is not limited thereto. Also, various ceramic additives, organic solvents, plasticizers, binders, dispersants and the like may be added to the ceramic powder according to the purpose of the present disclosure.

The average particle diameter of the ceramic powder used for forming the dielectric layer 111 is not particularly limited and may be adjusted for achieving the object of the present disclosure, but may be adjusted to, for example, 400 nm or less. Accordingly, the multilayer ceramic electronic component 100 according to an exemplary embodiment in the present disclosure may be used as a component requiring a small size and a high capacity as in the case of IT components.

For example, the dielectric layer 111 may be formed by applying a slurry formed of a powder such as barium titanate (BaTiO3) to a carrier film, and drying the slurry to provide a plurality of ceramic sheets. The ceramic sheet may be formed by mixing a ceramic powder, a binder and a solvent to prepare a slurry, and forming the slurry into a sheet having a thickness of several micro-meters by using a doctor blade method, but the present disclosure is not limited thereto.

First and second internal electrodes 121 and 122 may include at least one first internal electrode 121 and at least one second internal electrode 122 having different polarities from each other and may be formed to have a predetermined thickness with the plurality of dielectric layers 111 stacked in the thickness direction T of the dielectric layer 111 disposed therebetween.

The first internal electrode 121 and the second internal electrode 122 may be formed by printing a conductive paste including a conductive metal so as to alternately expose one side and another side of the ceramic body 110 in the length direction L along a stack direction of the dielectric layer 111 and may be electrically insulated from each other by the dielectric layers 111 arranged in the middle.

That is, the first and second internal electrodes 121 and 122 may be electrically connected to the first and second external electrodes 131 and 132, respectively, formed in both sides of the ceramic body 110 in the length direction L through parts alternately exposed to both sides of the ceramic body 110 in the length direction L.

For example, the first and second internal electrodes 121 and 122 may be formed of a conductive paste for internal electrodes including a conductive metal powder having an average particle size of 0.1 to 0.2 μm and 40 to 50% by weight, but are not limited thereto.

The conductive paste for internal electrodes may be applied on the ceramic sheet by using a printing technique or the like to form an internal electrode pattern. The conductive paste may be printed by using a screen printing method or a gravure printing method, but the present disclosure is not limited thereto. The ceramic body 110 may be manufactured by stacking, pressing and sintering 200-300 layers of the ceramic sheet printed with the internal electrode pattern.

Accordingly, when a voltage is applied to the first and second external electrodes 131 and 132, electric charges are accumulated between the first and second internal electrodes 121 and 122 opposing each other. At this time, the capacitance of the multilayer ceramic electronic component 100 is proportional to an area of an overlapping region of the first and second internal electrodes 121 and 122.

That is, when the area of the overlapping region of the first and second internal electrodes 121 and 122 is maximized, the capacitance of the multilayer ceramic electronic component 100 may be maximized even in capacitors of the same size.

The thicknesses of the first and second internal electrodes 121 and 122 may be determined according to the usage, for example, 0.4 μm or less. Accordingly, the multilayer ceramic electronic component 100 according to an exemplary embodiment in the present disclosure may be used as a component requiring a small size and a high capacity as in the case of IT components.

Since the thickness of the dielectric layer 111 corresponds to a distance between the first and second internal electrodes 121 and 122, the capacitance of the multilayer ceramic electronic component 100 may be increased as the thickness of the dielectric layer 111 is smaller.

Meanwhile, the conductive metal included in the conductive paste forming the first and second internal electrodes 121 and 122 may be either alone such as nickel (Ni), copper (Cu), palladium (Pd), silver (Ag), lead (Pb), platinum (Pb), etc. or an alloy thereof, but the present disclosure is not limited thereto.

The first and second external electrodes 131 and 132 may be disposed outside the ceramic body 110 to be connected to the first and second internal electrodes 121 and 122, respectively, and may be configured to electrically connect between the first and second internal electrodes 121 and 122 and a substrate.

The first and second external electrodes 131 and 132 respectively include first and second base electrode layers 131a and 132a being at least partially in contact with first and second external surfaces of the ceramic body 110, first and second nickel plating layers 131b and 132b disposed to cover the first and second base electrode layers 131a and 132a respectively and first and second tin plating layers 131c and 132c disposed to cover the first and second nickel plating layers 131b and 132b, respectively.

The first and second external electrodes 131 and 132 include conductive resin layers (not shown) disposed between the first and second base electrode layers 131a and 132a and the first and second nickel plating layers 131b and 132b according to the design, thereby having a further improved durability.

The first and second base electrode layers 131a and 132a may be relatively easily coupled to the first and second internal electrodes 121 and 122 compared to the plating layer, thereby reducing the contact resistance with respect to the first and second internal electrodes 121 and 122.

For example, the first and second base electrode layers 131a and 132a may be formed by dipping into a paste including a metal component or by printing a conductive paste including a conductive metal on at least one side of the ceramic body 110 in the thickness direction T and may be formed by using a sheet transfer method or a pad transfer method.

For example, the first and second base electrode layers 131a and 132a may be alone such as copper (Cu), nickel (Ni), palladium (Pd), platinum (Pt), gold (Au), lead (Pb), etc., or an alloy thereof.

The first and second nickel plating layers 131b and 132b are disposed between the first and second base electrode layers 131a and 132a and the first and second tin plating layers 131c and 132c, thereby preventing a reaction between the first and second base electrode layers 131a and 132a and the first and second tin plating layers 131c and 132c. Also, the first and second nickel plating layers 131b and 132b may improve equivalent series resistance (ESR), heat resistance and structural reliability.

The first and second nickel plating layers 131b and 132b and the first and second tin plating layers 131c and 132c may be formed by sputtering or electric deposition, but are not limited thereto.

According to the design, the first and second nickel plating layers 131b and 132b may contain not only nickel but also further alone such as copper (Cu), palladium (Pd), platinum (Pt), gold (Au), silver (Ag), lead (Pb), or the like, or an alloy thereof at a lower proportion than that of nickel.

Since the first and second tin plating layers 131c and 132c have a relatively low melting point, ease of substrate mounting of the first and second external electrodes 131 and 132 may be improved.

In general, a tin plating layer 131c or 132c may be bonded to an electrode pad 221 or 222 on a substrate 210 via a solder including a Sn—Cu—Ag alloy paste. That is, the tin plating layer 131c or 132c may be melted and bonded to the solder during a reflow process.

At this time, since the tin plating layer 131c or 132c may pull the ceramic body 110 outward in the length direction, the ceramic body 110 may be subjected to the tensile stress. Such tensile stress may cause cracks or delamination in the ceramic body 110. The smaller the thickness T of the ceramic body 110 with respect to a width W of the ceramic body 110, the more frequently the tensile stress cause cracks or delamination.

Therefore, the multilayer ceramic electronic component 100 according to an exemplary embodiment in the present disclosure include the first and second tin plating layers 131c and 132c of a great thickness such that the multilayer ceramic electronic component 100 may be mounted on first and second electrode pads 221 and 222 of the substrate 210 without a solder.

For example, a thickness Tc of the center portion of each of the first and second tin plating layers 131c and 132c may be greater than a thickness of a center portion of each of the first and second nickel plating layers 131b and 132b. Here, the thickness Tc of the center portion refers to a thickness in the length direction of the first and second tin plating layers 131c and 132c at the center portion when the first and second external electrodes 131 and 132 are viewed in the length direction.

Table 1 below shows the mounting defect frequency according to the thickness Tc of the center portion of the first and second tin plating layers 131c and 132c when the multilayer ceramic electronic component 100 is mounted on the substrate 210 without the solder.

TABLE 1

| Thickness of Tin Plating Layer | Mounting Defect Frequency |
|---|---|
| 1.17 | 1/10 |
| 3.21 | 1/10 |
| 5.98 | 0/10 |
| 7.62 | 0/10 |

Referring to Table 1 above, when the thickness Tc of the center portion of each of the first and second electrodes 131c and 132c exceeds 5 μm, the multilayer ceramic electronic component 100 according to an exemplary embodiment in the present disclosure may be mounted on the substrate 210 with high reliability without the solder, and thus the multilayer ceramic electronic component 100 may not be subjected to the tensile stress when mounted.

Accordingly, the multilayer ceramic electronic component 100 according to an exemplary embodiment in the present disclosure may be mounted on the substrate 210 with high reliability even if the thickness T of the ceramic body 110 is thinned to a half of the width W of the ceramic body 110 or less.

Since the first and second tin plating layers 131c and 132c are directly used for coupling between the external electrodes 131 and 132 and the first and second electrode pads 221 and 222, the multilayer ceramic electronic component 100 according to an exemplary embodiment in the present disclosure may be mounted on the substrate 210 through a reflow process optimized for melting points of the first and second tin plating layers 131c and 132c when mounted.

At this time, a part of the first and second tin plating layers 131c and 132c may melt and flow onto the first and second electrode pads 221 and 222. The part of the first and second tin plating layers 131c and 132c flowing onto the first and second electrode pads 221 and 222 are solidified after the reflow process, thereby physically coupling between the external electrodes 131 and 132 and the first and second electrode pads 221 and 222.

Accordingly, a thickness of a corner (for example, a lower side) closer to the first and second electrode pads among corners of the first and second tin plating layers 131c and 132c (T_corner) may be greater than the thickness of the center portion of the first and second tin plating layers 131c and 132c (Tc). Here, a direction of the thickness of the corner is perpendicular to a surface of the corner and is inclined by 45 degrees with respect to the thickness direction and the length direction.

Since the first and second tin plating layers 131c and 132c may not be melted in the solder including the Sn—Cu—Ag alloy paste, a surface of the first and second tin plating layers 131c and 132c contacting the first and second electrode pads 221 and 222 may not contain at least one of Ag or Cu.

Figure 3:
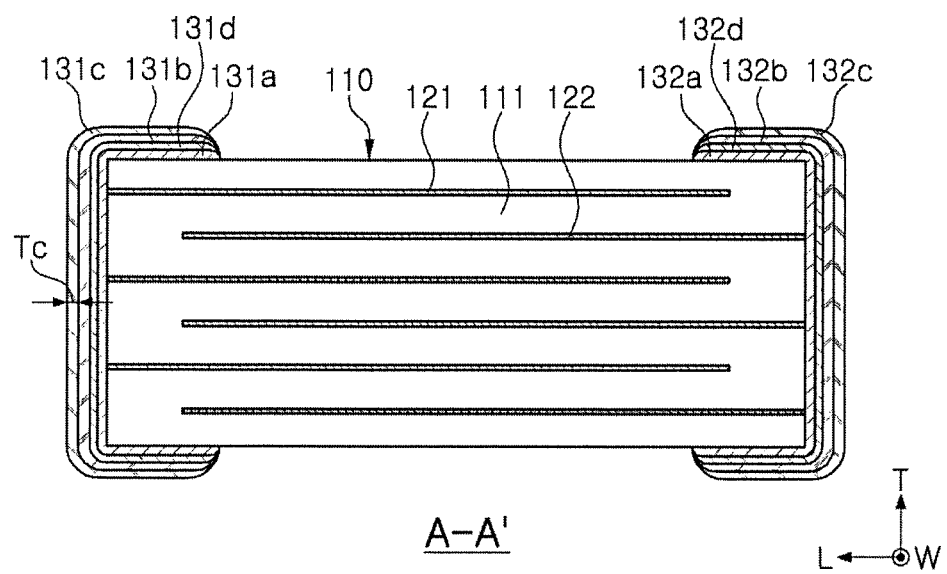
FIG. 3 is a side view illustrating a structure in which copper plating layers are additionally disposed in a multilayer ceramic electronic component according to an exemplary embodiment in the present disclosure.

FIG. 3 is a side view illustrating a structure in which copper plating layers 131d and 132d are additionally disposed in a multilayer ceramic electronic component according to an exemplary embodiment in the present disclosure.

Referring to FIG. 3, first and second external electrodes may further include the first and second copper plating layers 131d and 132d disposed between the first and second base electrode layers 131a and 132a and the first and second nickel plating layers 131b and 132b, respectively.

The first and second copper plating layers 131d and 132d may further balance the entire plating layer, thereby improving the moisture resistance reliability of the first and second external electrodes and further improving the structural stability of the first and second external electrodes.

The thickness Tc of the center portion of each of the first and second tin plating layers 131c and 132c may be greater than a thickness of a center portion of each of the first and second nickel plating layers 131b and 132b and may be greater than a thickness of a center portion of each of the first and second copper plating layers 131d and 132d. Accordingly, the multilayer ceramic electronic component according to an exemplary embodiment in the present disclosure may be mounted with higher reliability on the substrate 210 without a solder.

On the other hand, each of the first and second base electrode layers 131a and 132a may contain nickel most. Accordingly, the first and second copper plating layers 131d and 132d may be formed more stably on the first and second base electrode layers 131a and 132a.

Figure 4:
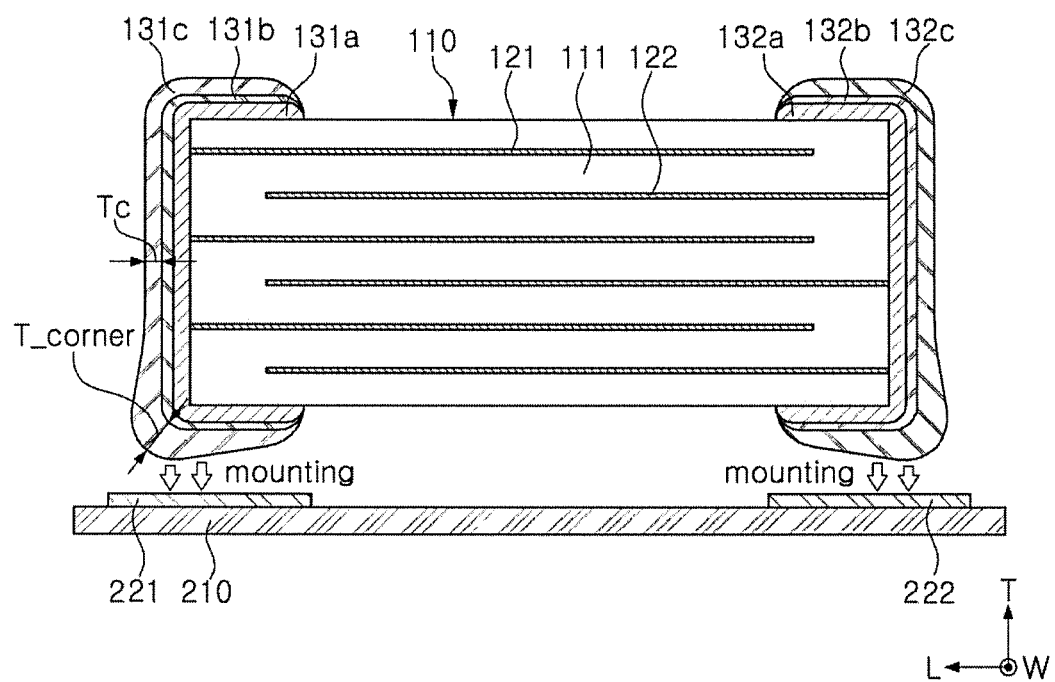
FIG. 4 is a side view illustrating thicknesses of tin plating layers of a multilayer ceramic electronic component according to an exemplary embodiment in the present disclosure.

FIG. 4 is a side view illustrating thicknesses of tin plating layers of a multilayer ceramic electronic component according to an exemplary embodiment in the present disclosure.

Referring to FIG. 4, a thickness of a corner (for example, a lower side) closer to the first and second electrode pads among corners of the first and second tin plating layers 131c and 132c (T_corner) may be greater than the thickness of the center portion of the first and second tin plating layers 131c and 132c (Tc).

Accordingly, the first and second tin plating layers 131c and 132c can be effectively used to mounting of first and second external electrodes, without solders.

For example, the thickness of the center portion of the first and second tin plating layers 131c and 132c (Tc) is greater than a thickness of a center portion of the first and second nickel plating layers 131b and 132b.

If first and second copper plating layers are displaced between the first and second base electrode layers 131a and 132a and the nickel plating layers 131b and 132b, the thickness of the center portion of the first and second tin plating layers 131c and 132c (Tc) may be greater than a thickness of a center portion of each of the first and second copper plating layers.

As set forth above, the multilayer ceramic electronic component according to the exemplary embodiment in the present disclosure may be mounted with high reliability on a substrate through a tin plating layer of an external electrode, and thus the multilayer ceramic electronic component may not be subjected to the tensile stress when mounted on the substrate.

Therefore, the multilayer ceramic electronic component according to the exemplary embodiment in the present disclosure may be mounted with high reliability on the substrate even if the multilayer ceramic electronic component is thinned.

While exemplary embodiments have been shown and described above, it will be apparent to those skilled in the art that modifications and variations could be made without departing from the scope in the present disclosure as defined by the appended claims.

What is claimed is:

1. A multilayer ceramic electronic component comprising:
a ceramic body including a dielectric layer and first and second internal electrodes stacked with the dielectric layer interposed therebetween, the first and second internal electrodes being alternately exposed to first and second external surfaces in a length direction; and
first and second external electrodes disposed on the first and second external surfaces of the ceramic body and electrically connected to the first and second internal electrodes, respectively,
wherein the first and second external electrodes respectively include:
first and second base electrode layers, each containing nickel, being at least partially in contact with the first and second external surfaces of the ceramic body, respectively;
first and second nickel plating layers disposed to cover the first and second base electrode layers, respectively;
first and second tin plating layers disposed to cover the first and second nickel plating layers, respectively; and
first and second copper plating layers disposed between the first and second base electrode layers and the first and second nickel plating layers, respectively, and
wherein a thickness of a corner portion of the first and second tin plating layers is greater than a thickness of a center portion of the first and second tin plating layers.

2. The multilayer ceramic electronic component of claim 1, wherein a thickness of the ceramic body is a half of a width of the ceramic body or less.

3. The multilayer ceramic electronic component of claim 1, wherein the thickness of the center portion of each of the first and second tin plating layers is greater than a thickness of a center portion of each of the first and second nickel plating layers, and is greater than a thickness of a center portion of each of the first and second copper plating layers.

4. The multilayer ceramic electronic component of claim 1, wherein the first and second base electrode layers each comprises a vertical portion disposed on the first and second external surfaces of the ceramic body, and an extending portion extending in the length direction from the vertical portion to cover portions of remaining external surfaces of the ceramic body other than the first and second external surfaces.

5. The multilayer ceramic electronic component of claim 1, wherein the thickness of the center portion of each of the first and second tin plating layers exceeds 5 µm.

6. A multilayer ceramic electronic component comprising:
a substrate;
first and second electrode pads disposed on the substrate;
a ceramic body including a dielectric layer and first and second internal electrodes stacked with the dielectric layer therebetween, the first and second internal electrodes being alternately exposed to first and second external surfaces; and
first and second external electrodes disposed on the first and second external surfaces of the ceramic body, the first and second external electrodes being electrically connected to the first and second internal electrodes, respectively, and electrically connected to the first and second electrode pads, respectively,
wherein the first and second external electrodes include first and second base electrode layers being at least partially in contact with the first and second external surfaces of the ceramic body, first and second nickel plating layers disposed to cover the first and second base electrode layers, and first and second tin plating layers disposed to cover the first and second nickel plating layers, respectively, and
wherein a thickness of a corner closer to the first and second electrode pads among corners of the first and second tin plating layers is greater than a thickness of a center portion of the first and second tin plating layers.

7. The multilayer ceramic electronic component of claim 6, wherein a thickness of the ceramic body is a half of a width of the ceramic body or less.

8. The multilayer ceramic electronic component of claim 6, wherein a thickness of the center portion of each of the first and second tin plating layers is greater than a thickness of a center portion of each of the first and second nickel plating layers.

9. The multilayer ceramic electronic component of claim 6, wherein the thickness of the center portion of each of the first and second tin plating layers exceeds 5 µm.

10. The multilayer ceramic electronic component of claim 6, wherein a surface of the first and second tin plating layers contacting the first and second electrode pads does not contain at least one of Ag or Cu.

11. The multilayer ceramic electronic component of claim 6, wherein an average thickness of the dielectric layer disposed between the first and second internal electrodes is 0.4 µm or less, and wherein an average thickness of the first and second internal electrodes is 0.4 µm or less.

\* \* \* \* \*